(12) United States Patent
Shimoda et al.

(10) Patent No.: US 7,062,081 B2
(45) Date of Patent: Jun. 13, 2006

(54) METHOD AND SYSTEM FOR ANALYZING CIRCUIT PATTERN DEFECTS

(75) Inventors: Atsushi Shimoda, Hiratsuka (JP); Ichirou Ishimaru, Mure (JP); Yuji Takagi, Kamakura (JP); Takuo Tamura, Yokohama (JP); Yuichi Hamamura, Yokohama (JP); Kenji Watanabe, Oume (JP); Yasuhiko Ozawa, Abiko (JP); Seiji Isogai, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 564 days.

(21) Appl. No.: 09/783,604

(22) Filed: Feb. 15, 2001

(65) Prior Publication Data

US 2001/0016061 A1    Aug. 23, 2001

(30) Foreign Application Priority Data

Feb. 15, 2000    (JP)    ............................. 2000-036894

(51) Int. Cl.
*G06K 9/00*    (2006.01)

(52) U.S. Cl. ................................... 382/149; 356/237.3

(58) Field of Classification Search ................ 382/149, 382/144–148, 150, 151, 141, 190, 218, 224; 702/35, 36; 356/237.1, 237.2, 237.3, 237.4, 356/237.5; 438/14, 16, 17; 348/86, 87, 348/125, 126

See application file for complete search history.

(56) References Cited

U.S. PATENT DOCUMENTS

| | | | | |
|---|---|---|---|---|
| 5,761,337 | A * | 6/1998 | Nishimura et al. | 382/150 |
| 5,801,965 | A * | 9/1998 | Takagi et al. | 702/35 |
| 5,841,893 | A * | 11/1998 | Ishikawa et al. | 382/145 |
| 5,966,459 | A * | 10/1999 | Chen et al. | 382/149 |
| 6,496,596 | B1 * | 12/2002 | Zika et al. | 382/149 |
| 6,535,776 | B1 * | 3/2003 | Tobin et al. | 700/110 |
| 6,597,381 | B1 * | 7/2003 | Eskridge et al. | 345/804 |

FOREIGN PATENT DOCUMENTS

| | | | |
|---|---|---|---|
| JP | 08021803 A * | 1/1996 | |
| JP | 11176899 A * | 7/1999 | |

* cited by examiner

*Primary Examiner*—Samir Ahmed
(74) *Attorney, Agent, or Firm*—Antonelli, Terry, Stout and Kraus, LLP.

(57) ABSTRACT

In order to allow critical flaws in an inspected item to be determined early during a production process, the present invention includes the following steps: a step of detecting defects in a production process for the inspected item and storing defect positions; a step of collecting detailed defect information and storing the detailed information in association with defect positions; a step of storing positions at which flaws were generated based on a final inspection of the inspected item; a step of comparing defect positions with positions at which flaws were generated; and a step of classifying and displaying detailed information based on the comparison results.

11 Claims, 11 Drawing Sheets

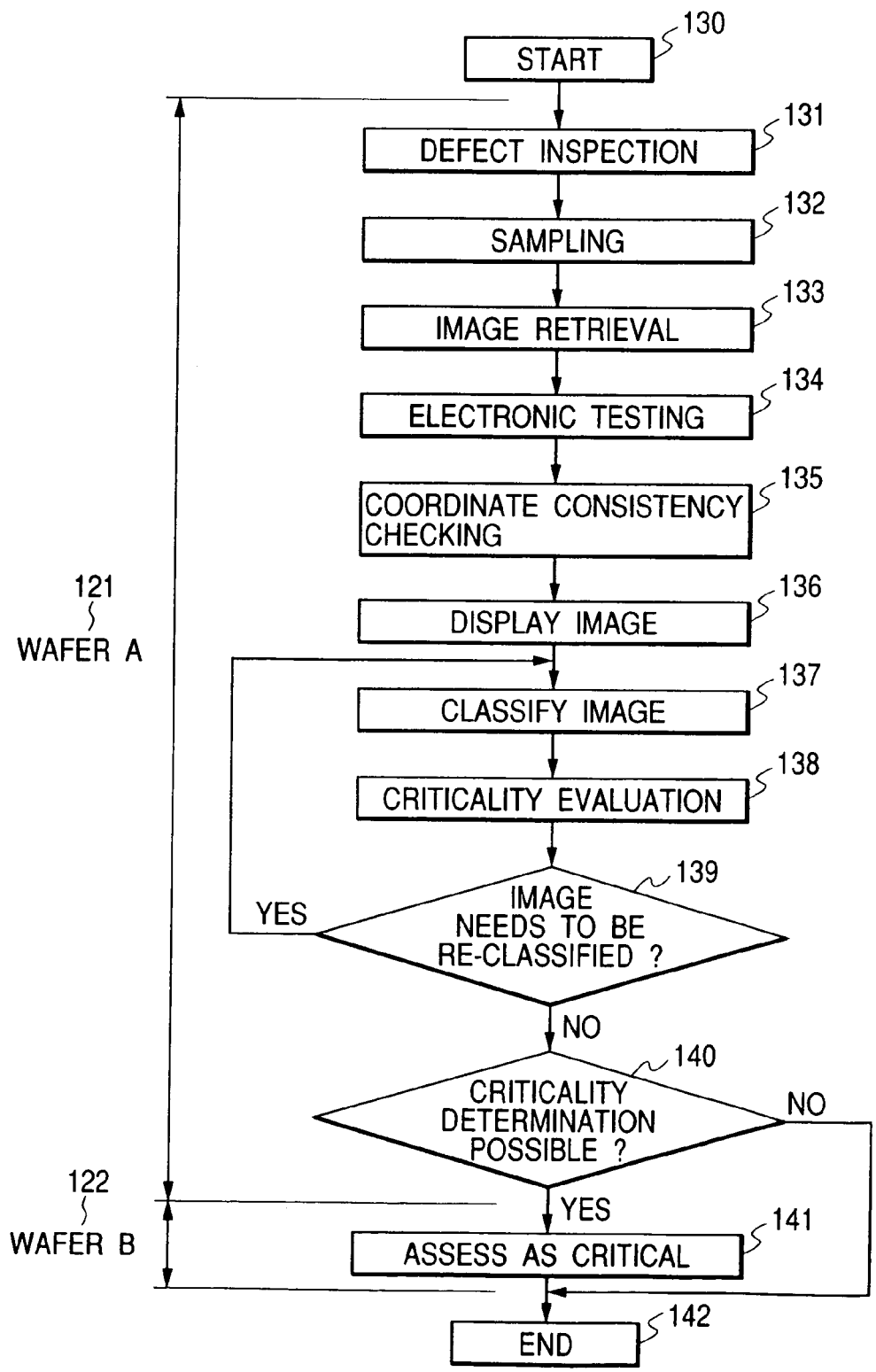

FIG. 5

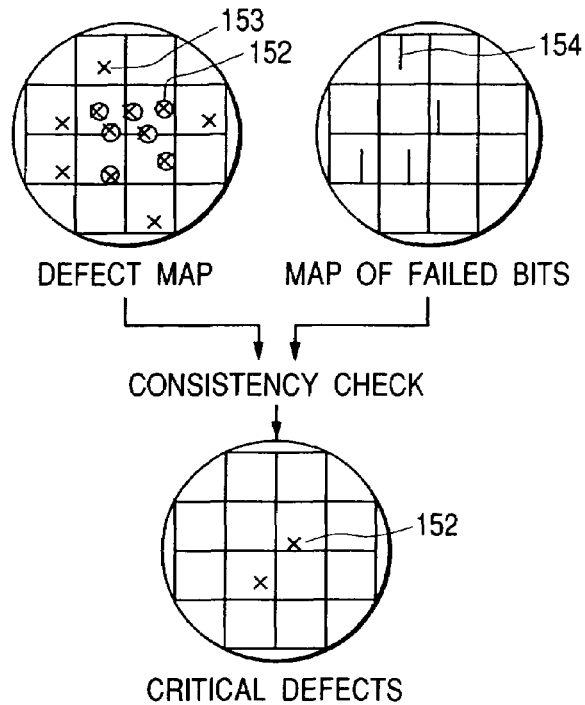

DEFECT MAP    MAP OF FAILED BITS

CONSISTENCY CHECK

CRITICAL DEFECTS

FIG. 6

| DEFECT NUMBER | CHIP COORDINATES | DEFECT COORDINATES | SAMPLING FLAG | IMAGE NAME | TEST RESULT |
|---|---|---|---|---|---|
| 1 | (2, 0) | ($\Delta X1, \Delta Y1$) | 0 | | G |
| 2 | (0, 1) | ($\Delta X2, \Delta Y2$) | 0 | | G |
| 3 | (1, 1) | ($\Delta X3, \Delta Y3$) | 1 | IMAGE 3 | N |
| 4 | (2, 1) | ($\Delta X4, \Delta Y4$) | 1 | IMAGE 4 | N |
| 5 | (0, 2) | ($\Delta X5, \Delta Y5$) | 0 | | G |
| 6 | (1, 2) | ($\Delta X6, \Delta Y6$) | 1 | IMAGE 6 | G |
| 7 | (1, 2) | ($\Delta X7, \Delta Y7$) | 1 | IMAGE 7 | G |
| 8 | (1, 2) | ($\Delta X8, \Delta Y8$) | 1 | IMAGE 8 | G |
| 9 | (2, 2) | ($\Delta X9, \Delta Y9$) | 1 | IMAGE 9 | N |
| 10 | (2, 2) | ($\Delta X10, \Delta Y10$) | 1 | IMAGE 10 | N |
| 11 | (3, 2) | ($\Delta X11, \Delta Y11$) | 0 | | G |
| 12 | (1, 3) | ($\Delta X12, \Delta Y12$) | 0 | | N |

ALL DEFECTS (IN ORDER OF IMAGING)

CRITICAL DEFECTS | NON-CRITICAL DEFECTS

CRITICAL DEFECTS | NON-CRITICAL DEFECTS

FIG. 10(a)
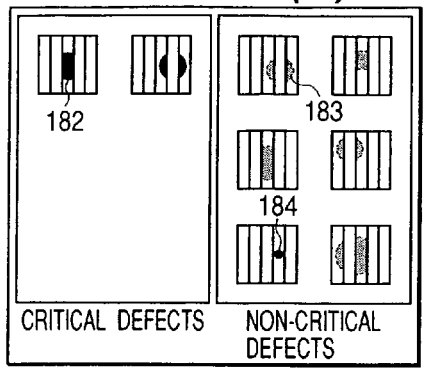
CRITICAL DEFECTS | NON-CRITICAL DEFECTS
182, 183, 184

FIG. 10(b)
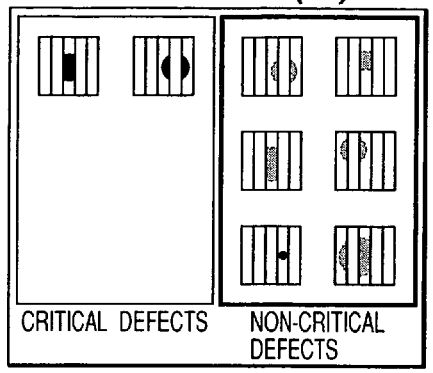
CRITICAL DEFECTS | NON-CRITICAL DEFECTS

FIG. 10(c)
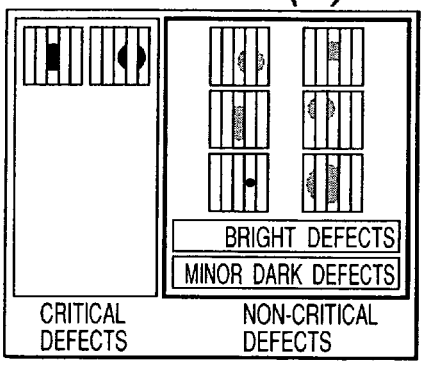
CRITICAL DEFECTS | NON-CRITICAL DEFECTS (BRIGHT DEFECTS / MINOR DARK DEFECTS)

FIG. 10(d)
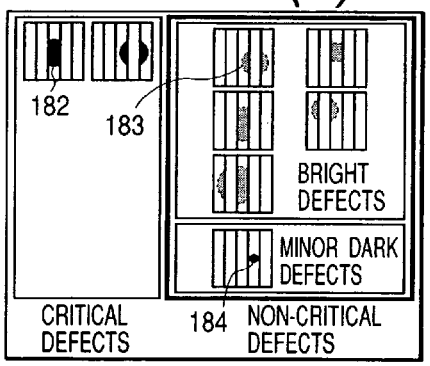
182, 183, 184
CRITICAL DEFECTS | NON-CRITICAL DEFECTS (BRIGHT DEFECTS / MINOR DARK DEFECTS)

FIG. 11

| DEFECT NUMBER | CHIP COORDINATES | DEFECT COORDINATES | SAMPLING FLAG | IMAGE NAME | TEST RESULT | IMAGE CLASSIFICATION |
|---|---|---|---|---|---|---|
| 1 | (2, 0) | ($\Delta X1, \Delta Y1$) | 0 |  | G | G |
| 2 | (0, 1) | ($\Delta X2, \Delta Y2$) | 0 |  | G | G |
| 3 | (1, 1) | ($\Delta X3, \Delta Y3$) | 1 | IMAGE 3 | N | N |
| 4 | (2, 1) | ($\Delta X4, \Delta Y4$) | 1 | IMAGE 4 | N | N |
| 5 | (0, 2) | ($\Delta X5, \Delta Y5$) | 0 |  | G | G |
| 6 | (1, 2) | ($\Delta X6, \Delta Y6$) | 1 | IMAGE 6 | G | G |
| 7 | (1, 2) | ($\Delta X7, \Delta Y7$) | 1 | IMAGE 7 | G | G |
| 8 | (1, 2) | ($\Delta X8, \Delta Y8$) | 1 | IMAGE 8 | G | G |
| 9 | (2, 2) | ($\Delta X9, \Delta Y9$) | ① | IMAGE 9 | N | N |
| 10 | (2, 2) | ($\Delta X10, \Delta Y10$) | 1 | IMAGE 10 | N | N |
| 11 | (3, 2) | ($\Delta X11, \Delta Y11$) | 0 |  | G | G |
| 12 | (1, 3) | ($\Delta X12, \Delta Y12$) | 0 |  | N | N |

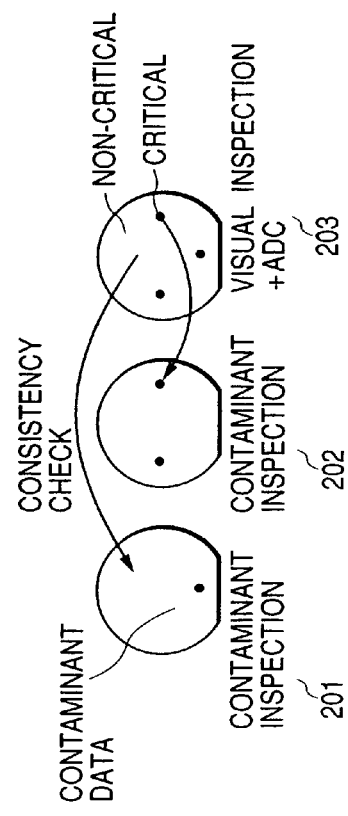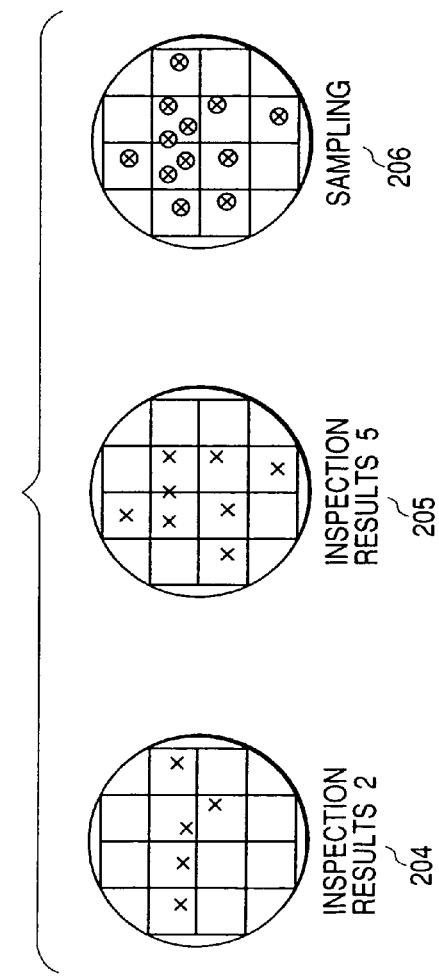

METHOD AND SYSTEM FOR ANALYZING CIRCUIT PATTERN DEFECTS

BACKGROUND OF THE INVENTION

The present invention relates to a method and system for analyzing defects in electronic circuits produced by forming electronic circuit patterns on a substrate. More specifically, the present invention relates to defect analysis technology for accurately evaluating the electronic criticality of defects generated in intermediate processes and performing analysis thereof with priority being given to defects having a high electronic criticality. In particular, the present invention provides a technology suitable for use in electronic circuit production, where production takes place through multiple production processes, such as in semiconductor devices.

Semiconductor device production involves hundreds of production processes and requires dozens of days from the start of wafer processing to completion. The object of each of the production processes is to provide proper electronic operation at the time of completion. For this reason, it is important to discover, during intermediate processes, critical defects off the type that will lead to electronic faults upon completion and to prevent these defects from being generated.

Japanese laid-open patent publication number Hei 11-176899 (the first conventional technology) describes a defect warning method and a defect warning system. When a testing process performed at the end of the wafer production process is reached, a consistency check is performed between coordinates of defects detected in inspections performed at intermediate processes and coordinates of faults detected in the testing process. The process and location of the generation of critical defects leading to faults is determined in the testing process and an evaluation value is calculated. A warning is issued if the evaluation value exceeds a predetermined threshold value.

Japanese laid-open patent publication number Hei 8-21803 (the second conventional technology) describes a defect type evaluation device. Defect images are captured at an intermediate process, and defect information extracted from the defect images are provided as an input to a neural processing unit. Defect types are identified from the output. In this conventional technology, defects representative of different defect types are used as samples for preliminary training. The samples are prepared manually through observation and classification of defect images. Image characteristics extracted from the defect images through image processing are used for the defect information provided as an input to the neural processing unit.

In the first conventional technology described above, critical defects cannot be evaluated until the semiconductor device is completed and the testing process is reached. As a result, there is a delay between the time when a defect is generated and the time when further defects can be measured, making production of faulty products unavoidable. If critical defects are repeatedly generated at the same place on wafers, the coordinates obtained from inspections at intermediate processes can be used to detect generation of critical defects. However, this applies only to these restricted cases.

In the second conventional technology, defects can be classified in intermediate processes into categories based on similar image characteristics. However, accurate classification of critical defects and non-critical defects is difficult. To accurately classify critical defects, the accurate preparation of samples used for training is important. However, preparing accurate critical defect samples for different types of defects generated in the production process through manual observation and classification is difficult. For example, with adhesion of contaminants on an electronic circuit pattern, not all contaminants will lead to a critical defect. The probability that a contaminant will lead to a short-circuit defect will vary greatly depending on whether the contaminant is formed from a conductive material or a non-conductive material. Also, the probability that a containment will lead to a short-circuit defect will vary depending on the relation between the height of the containment and the thickness of the film forming the electronic circuit pattern. Information relating to the material and height of contaminants is difficult to identify through manual observation of defect images.

SUMMARY OF THE INVENTION

An object of the present invention is to overcome the problems described above and to clarify the relation between detailed defect information and electronic criticality based on objective data processing. The detailed information here refers to microscope images, SEM images, EDX analysis curves, and the like, and will depend on the type of detecting device used.

Another object of the present invention is to provide means for accurately evaluating electronic criticality of defects in intermediate processes by classifying defects based on this detailed information. With the present invention, generation of critical defects during intermediate processes can be detected accurately. By giving priority to critical defects when taking preventative measures, production of faulty products can be kept to a minimum.

In order to achieve the objects described above, the present invention provides a method of analyzing defects detected in the production process of an electronic circuit pattern. A defect on the inspected object is detected, and the position information for this detected defect is stored. Detailed information on this defect is collected for this defect for which position information was stored. This collected detailed information is associated with the defect position information and stored. The inspected object is electronically tested, and information on positions at which faults are generated in this electronic test is stored. The stored defect position information and the fault-generating position information are compared, and the detected defect is classified based on the results of this comparison. Then, information relating to this classified defect is displayed.

In another aspect of the present invention, the present invention provides a system for analyzing defects detected in the production process of an electronic circuit pattern. First storing means stores defect position information obtained by detecting defects on an inspected object. Second storing means stores detailed information observed on the basis of defect position information stored in the first storing means in association with position information for this defect. Third storing means stores information on positions of faults generated by an electronic test when the inspected object is electronically tested. Then, the defect position information stored in the second storing means is compared with fault generating position information stored in the third storing means. Next, detailed information stored in the second storing means is classified based on the comparison results. Finally, information relating to the detailed classified information is outputted.

These and other objects, features and advantages of the invention will be apparent from the following more particular description of preferred embodiments of the invention, as illustrated in the accompanying drawings.

BRIEF DESCRIPTION OF THE DRAWINGS

FIG. 4 is a flowchart showing the sequence of operations performed in defect analysis according to a first embodiment of the present invention.

FIG. 5 is a diagram illustrating examples of consistency checking operations.

FIG. 6 is a table showing an example of how consistency checking results are stored.

FIGS. 10(a) to 10(d) are diagrams of dark contaminants and bright contaminants.

FIG. 11 is a table showing examples of criticality rate calculations.

FIG. 14 is a diagram which shows a concept of a coordinate consistency checking operation.

FIG. 15 is a diagram which shows an example of a sampling operation.

DESCRIPTION OF THE PREFERRED EMBODIMENTS

The embodiments of the present invention, as applied to a production process for semiconductor devices, will be described in detail with reference to the accompanying drawings.

Figure 1:
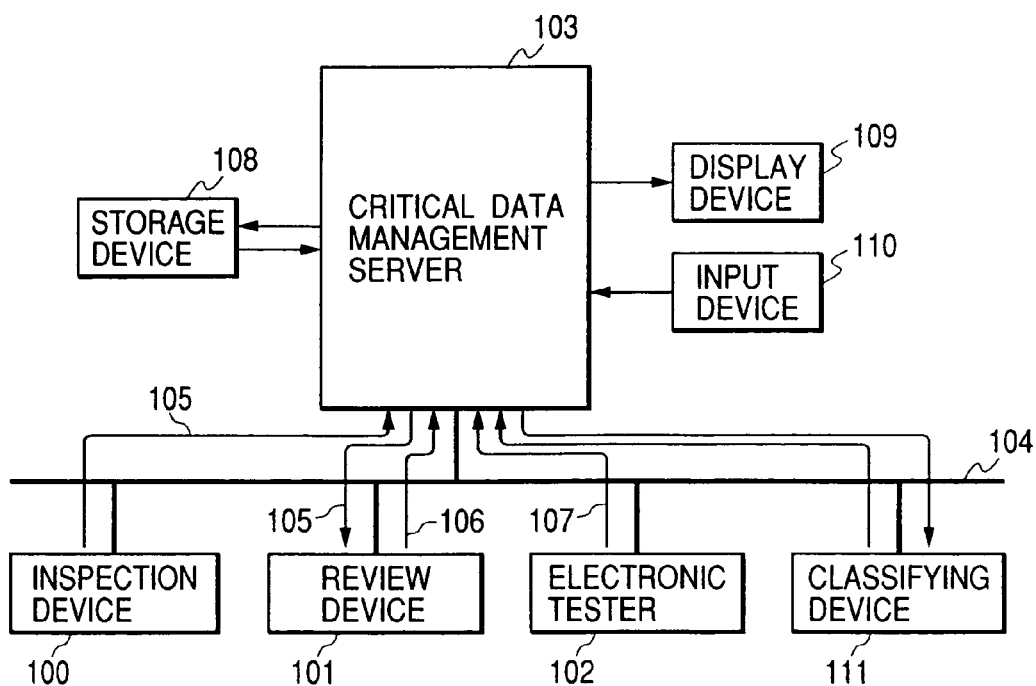
FIG. 1 is a block diagram showing the architecture of a defect analysis system according to an embodiment of the present invention.

FIG. 1 is a block diagram showing a defect analysis system relating to a first embodiment of the present invention. As the figure shows, the defect analysis system of this embodiment includes an inspection device 100, a review device 101, an electronic tester 102, a defect data management server 103, a classifying device 111, and a network 104 connecting these elements. FIG. 1 shows one example implementation of this invention, but it would also be possible to have, for example, the classifying device 111 equipped with the functions of a display device 109, an input device 110, and a storage device 108. In addition, the classifying device 111 may also be formed as a part of the defect data management server 103, the inspection device 100, or the review device 101.

Figure 2:
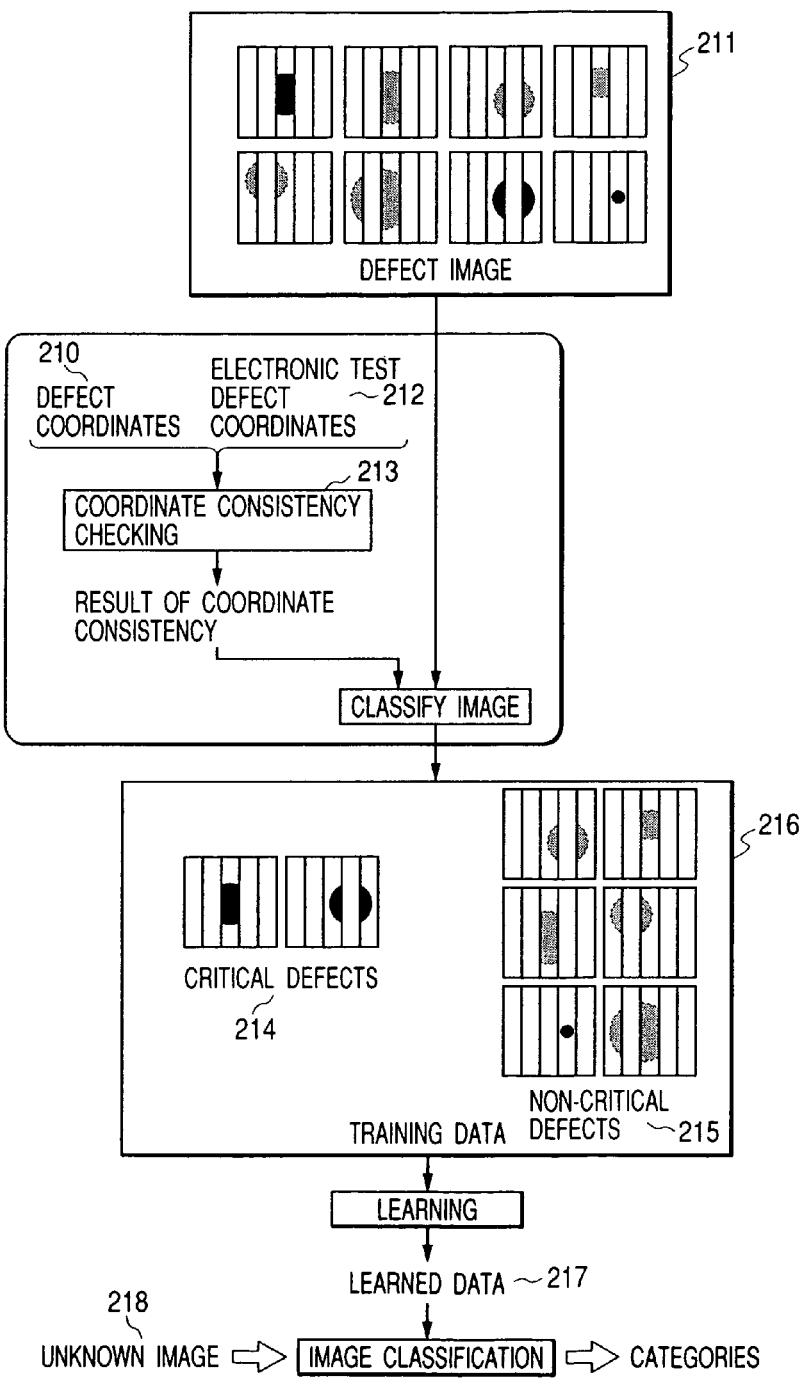
FIG. 2 is a flowchart of image classification steps using training data.

The flow of operations performed by the architecture shown in FIG. 1 will be described, with reference to FIG. 2. First, the inspection device 100 is used to perform a defect inspection of the wafer. When this inspection is completed, the review device 101 retrieves defect images 211 corresponding to defect coordinates 210 obtained from the defect inspection results and indicating positions of defects on the wafer. The associations between the images and the coordinates are stored in the storage device 108 by way of the defect data management server 103. Next, the electronic tester 102 performs an electronic test of the same wafer and determines fault coordinates 212 from the test. The defect data management server 103 performs a consistency check 213 between the defect coordinates 210 and the electronic testing fault coordinates 212. This operation allows the defect coordinates 210 to be classified into critical defects 214, which match the electronic test fault coordinates 212, and noncritical defects 215, which do not match. By using the associations between defect coordinates 210 and the defect images 211, the defects images 211 can be classified a critical defects 214 group and a non-critical defects 215 group. Based on the results of this classification and using the defect images belonging to the critical defects 214 and the noncritical defects 215, the classification device 111 obtains training data 216, in which image characteristics are quantified. This training data 216 has a high correlation with the electronic test results. Furthermore, the classification device 111 can generate learned data 217, which contains parameters for converting image characteristics into categories, based on the training data 216. This would allow an unknown image 218 detected by a different wafer defect inspection to be classified accurately into the critical defects 214 group or the non-critical defects 215 group.

The individual devices in the system will be described.

The inspection device 100 detects positions on the wafer surface where contaminants and circuit pattern deformations are present and outputs the coordinate data for these positions. The inspection device 100 is formed from an automated stage, a detection optical system, a linear sensor, an image processing device, and the like. The inspection is performed as follows. A linear sensor disposed at the imaging position of a microscope in the detection optical system continuously captures images while the automated stage, on which a wafer is mounted, is moved. Images for positions at which identically shaped circuits are present are compare by the image processing device, and areas with different brightnesses are detected as defects. The coordinate data for these areas are output. Output coordinate data 105 is sent to the defect data management server 103 by way of the network 104.

The role of the inspection device 100 is to visually inspect circuit patterns to determine the number of critical defects that will lead to electronic faults during a process in which the electronic operation of the semiconductor device cannot be tested. By preventing critical defects from taking place, production of faulty products can be minimized and the yield can be improved.

The review device 101 collects detailed information on the defects detected by the inspection device 100 and includes an automated stage, a detection system, a memory device, and the like. The detailed information can be optical microscope images, SED images, EDX analysis curves, or the like, and depends on the type of detection system used. The re view device 101 operates as follows. The defect coordinate data 105 is received from the defect data management server 103 by way of the network 104. The automated stage on which the wafer is mounted is moved to the defect position, and the detection system is used to collect detailed defect information, to the defect data management server 103 by way of the network 104.

The role of the review device 101 is to collect detailed information on the defects detected by the inspection device 100 to be used to select the critical defects. The defects detected by the inspection device 100 include coloration defects and contaminant defects, which are electronically functional and not critical defects, in addition to critical defects. Thus, critical defects need to be identified using the defect information. Furthermore, another role of the review device 101 is to classify defects using the detailed information. This allows the primary mode of defects to be determined so that the causes can be identified.

Since the inspection device 100 can perform high-speed inspection over a wide area, collecting detailed information at the same time as performing inspection is difficult. The review device 101 is necessary because it allows detailed information to be collected by returning to the defect position. However, if the detecting means in the inspection device 100 can be switched, the inspection device 100 can be equipped with the functions of the review device 101.

Since the number of defects for which detailed information can be collected by the review device 101 is limited by time factors, it is also possible to use the defect information output by the inspection device 100 during inspection in place of the detailed information. In this case, the amount of information in the defect information output by the inspection device 100 will be less than the detailed information collected by the review device 101, but the lack of a time delay allows general tendencies to be determined in a short period of time.

If the defect information output from the inspection device 100 in the present invention, the information can be treated in the same manner as the detailed information collected by the review device 101. Also, defects for which detailed information is to be collected using the review device 101 can be selected based on the classification results of the defect information output from the inspection device 100.

The electronic tester 102 checks electronic operations after the semiconductor device is completed. The electronic tester 102 includes an automated stage, an electronic probe, an electronic circuit device, and the like. The electronic tester 102 operates as follows. The completed wafer is mounted on the automated stage and the electronic probe is successively positioned at individual chip positions. Potential is applied with the electronic probe placed in contact with the individual chip, and a test is performed using the electronic circuit device. For example, with a memory product, a map of failed bits, containing a detailed record of positions of faulty bits on the wafer, can be obtained. Test results 107 output from the electronic tester 102 are sent to the defect data management server 103 by way of the network 104 and are stored in the storage device 108.

The defect data management server 103 is a computer system connected to the network 104 and includes a CPU device, a memory device, a storage device 108, a display device 109, an input device 110, and the like. The server 103 sends and receives information to and from the inspection device 100, the review device 101, and the electronic tester 102. The server 103 is also equipped with data processing functions (sampling, coordinate consistency checking, image classifying, criticality evaluation, criticality checking) and serves as the key element of the present invention. The detailed operations of the defect data management server 103 will be described later.

The classifying device 111 is a computer system that visually classifies critical in an automated manner. The classifying device 111 passes data back and forth with the critical data management server 103, the inspection device 100, the review device 101, and the like, by way of the network 104.

The operations of the classifying device 111 will be described. A program installed in the classifying device 111 uses a known pattern recognition method such as described in "Image Analysis Handbook" (Takaki, et al., Tokyo Daigaku Shuppankai, 1991, pp. 171–205, pp. 641–688). In this pattern recognition method, characteristics of a sample image set up beforehand are compared with the characteristics of an unknown image. The unknown image is classified based on similarities of characteristics. Using a defect image as an example, the characteristics can be numerical data relating to defect color (including brightness), size, and shape.

The classifying device 111 performs training operations and classifying operations. Training operations are performed using training data prepared by an operator. The training data is prepared by the operator, who studies defect images displayed on the display device 109 of the defect data management server 103 and selects sample images using the input device 110 or the like. The sample images and its classifications selected from the display device 109 are stored as the training data. This training data is transferred from the defect data management server 103 to the classifying device 111.

In the training operation, the characteristics of the sample image are extracted, and these characteristics and the training data are used to calculate parameters for converting characteristics to classifications. In the classifying operation, the characteristics of the unknown image transferred from the review device 101 are extracted, and a classification is determined using the conversion parameters generated in the training operation. The determined classification is stored in the storage device 108 in association with the defect image.

For the classifying device 111 to operate correctly, it is important that the sample image correctly classified in the training step. In the classifying device 111, that is implemented using an ADC (Automatic Defect Classification) device. An example in which an ADC device is used in the present invention will be described in detail later.

Figure 3:
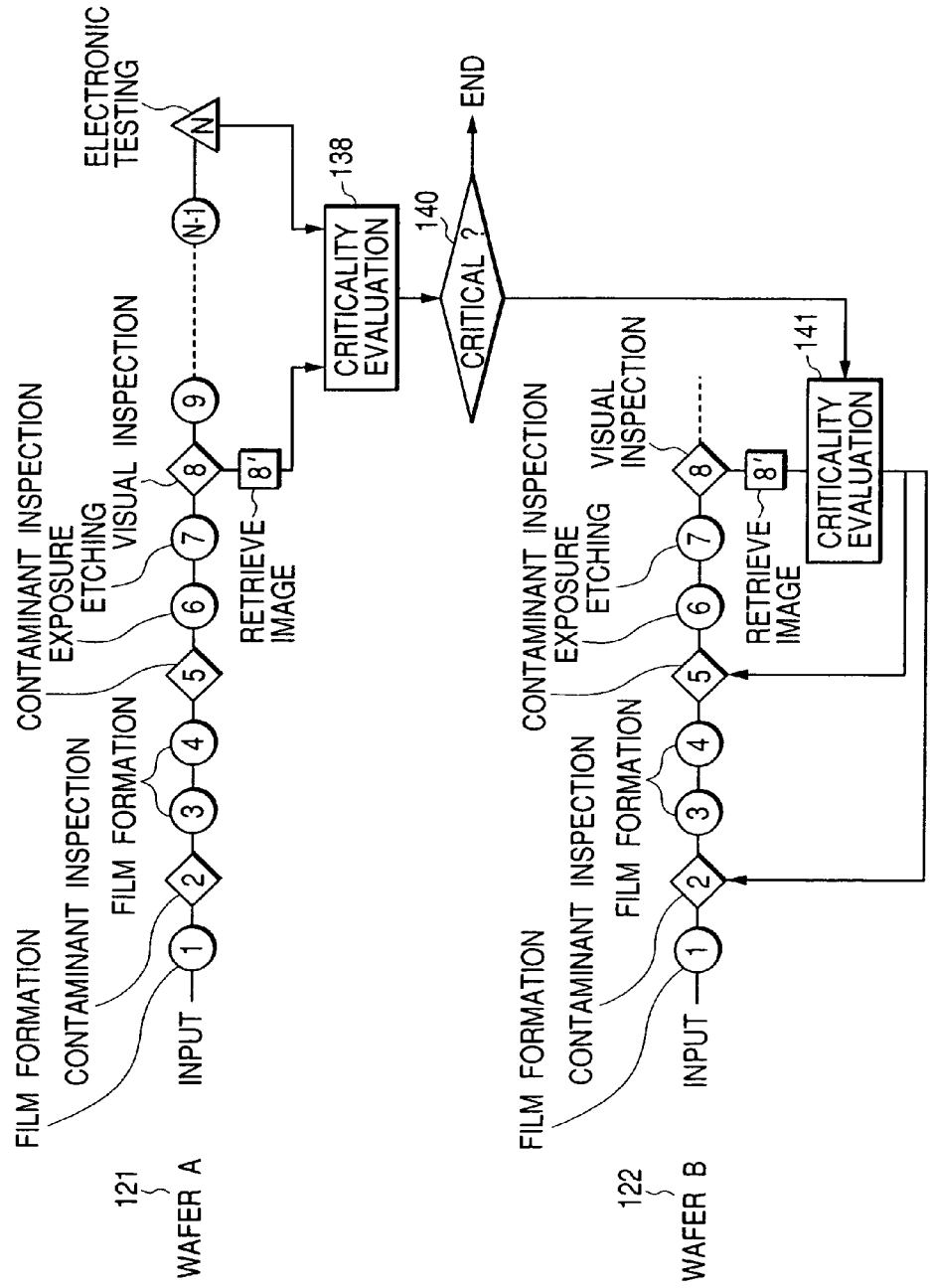
FIG. 3 is a flowchart showing an example of a semiconductor device production process flow according to an embodiment of the present invention.

FIG. 3 shows an example in which the present invention is used in a semiconductor device production process. The defect analysis method of the present invention involves a preparation step using a wafer A 121 and an active step using a wafer B 122. The wafer A 121 and the wafer B 122 refer to the use of distinct wafers rather than two specific wafers. In the preparation step, it would be desirable to use a small number of wafers A 121 while collecting as large a number of defect samples as possible. Thus, it would be preferable to use multiple wafers rather than just one. Also, it would be preferable to have these multiple wafers drawn from separate lots. Also, the wafers A and the wafers B can be of different types as long they are produced using similar processes.

The following is a description of the flow of operations in an example using the wafer A 121.

When the wafer A 121 is sent to the production process, the processes indicated by the circles in FIG. 3 are performed successively. A circuit pattern is formed by repeating film formation processes 1, 3, 4, exposure process 6, and etching 7. In addition, there are ion implantation, cleaning, and other processes, but these are not shown in the figure.

Inspections, indicated by diamonds in FIG. 3, are performed between the main processes. In particular, contaminant inspection processes 2, 5 are performed after film formation processes, which generate a lot of contaminants. Also, visual inspection process 8, which can detect pattern defects, is performed after the circuit pattern is formed by the etching process 7. In this inspection, contaminants on the wafer surface and circuit pattern deformations are detected by an automated inspection device. The position information for these detected contaminants and circuit pattern deformations is output in the form of coordinate data.

However, defects detected by the automated inspection device will not necessarily be critical defects having electronic significance. Some of the defects may be discoloration defects and contaminant defects which are electronically functional and not critical defects. Thus, selecting the critical defects out of the detected defects becomes important. While it would be desirable to perform inspections before and after each individual process, inspections are carried out only after the main processes. This is due to restrictions related to production times and inspection costs. Once the electronic circuit is completed and after all the processes are finished, an electronic test is performed to check electronic operations.

This inspection system allows detection of critical defects generated in processes before the wafer is completed. By taking measures in response to these defects, faults in the subsequently produced wafer B 122 can be minimized. The semiconductor device production process shown in FIG. 3 will be described in detail, with reference to FIG. 4.

FIG. 4 is a flowchart illustrating the sequence of operations used in an inspection according to this embodiment. The following is a description of the specific implementation steps based on FIG. 4 and with reference to FIG. 1 and FIG. 3. In the flowchart in FIG. 4, there is a preparatory step using the wafer A 121 and an active step using the wafer B 122. In the description below, defect images are used as an example of detailed defect information.

(1) Defect Inspection

In FIG. 4, defect inspection 131 corresponds to the visual inspection process 8 from FIG. 3. At this stage, the wafer A 121 from FIG. 3 has passed through the processes 1, 3, 4, 6, 7 and contaminant inspection processes 2, 5, and has reached the visual inspection process 8. The visual inspection process 8 is performed after the circuit pattern has been formed by the etching process 7, so that the effect of defects on the circuit pattern can be determined. The visual inspection process 8 is performed by the inspection device 100 from FIG. 1. The coordinate data output (defect map) is sent to the defect data management server 103 by way of the network 104 and is stored in the storage device 108.

(2) Sampling

In FIG. 4, a sampling step 132 samples defects for which detailed information is to be collected using the defect map from the visual inspection process 8. Since the inspection device 100 performs high-speed inspection, digital images of the wafer surface with a low resolution are used. The low-resolution digital images allow the presence of defects to be determined, but collecting detailed information that can accurately identify the appearance of a defect and the like is difficult. Thus, after inspection, detailed information must be collected by capturing a finer digital image of a defect or the like. Since high-resolution digital images are captured by moving the wafer successively, the time required is proportional to the number of defects.

Since several hundreds to several thousand defects may be detected on the wafer by the inspection device 100, these must be narrowed to less than a hundred coordinate points to allow fine digital images to be captured within a limited amount of time. In the sampling operation, the defect data management server 103 from FIG. 1 reads a defect map from the storage device 108 and sends the map to the review device 101 by way of the network 104. The sampling operation will be described in detail later.

(3) Image Retrieval

An image retrieval step 133 shown in FIG. 4 corresponds to the process 8' from FIG. 3 and involves recording fine digital images of the sampled coordinates. This is one example of how detailed defect information can be collected. Alternatively, methods such as collecting EDX analysis curves can be used to collect detailed defect information. Image retrieval is performed by the review device 101 from FIG. 1. The inspection device 100 moves the wafer to align it. The sampled coordinate data 105 is received from the defect data management server 103 by way of the network 104, and the stage is moved to the defect position using the coordinate data. A defect image is then captured. The captured defect image 106 is sent to the defect data management server 103 by way of the network 104 and is stored in the storage device 108 in association with defect coordinates.

(4) Electronic Testing

An electronic testing step 134 in FIG. 4 corresponds to a process N from FIG. 3 and is an electronic inspection performed after the wafer A 121 has passed through the predetermined processes. This step is performed by the electronic 102 from FIG. 1. Coordinate data for electronic faults and position data for defective chips are sent to the defect data management server 103 by way of the network 104 and are stored in the storage device 108.

(5) Coordinate Consistency Checking

In a coordinate consistency checking step 135 in FIG. 4, the results from the defect map and the electronic test are compared to study consistencies and inconsistencies between the two. A defect map and test results from the storage device 108 in the defect data management server 103 from FIG. 1 are stored in memory and used. The results of the consistency check are stored in the storage device 108 as electronic data, to be described later.

FIG. 5 shows an example of a consistency checking operation. In this figure, a map of failed bits is compared with a defect map. Precise faulty bit positions 154 are recorded on the map of failed bits and comparing these with defect coordinates provides an accurate evaluation of the criticality of individual defects.

The evaluation of whether a faulty bit matches a defect is performed by determining a match when the two points are closer than a predetermined distance. This distance is the margin of error for defect coordinates output by the inspection device 100 and can be measured beforehand. This distance is entered in the defect data management server 103 from FIG. 1 beforehand.

Instead of a map of failed bits, it is also possible to use electronic test results from a short-circuit checking TEG (Test Element Group). The short-circuit checking TEG is a striped dummy pattern formed with the same process as used in the manufacture of the product. By measuring the electronic characteristics of the ends of the stripes, short-circuits or circuit breaks can be detected. By comparing the striped areas containing short-circuits or circuit brakes with defect coordinates, electronically critical defects can be identified.

FIG. 6 shows the stored results of the coordinate consistency checking operation. The coordinate consistency checking operation is performed in the defect data management server 103 from FIG. 1 and results are stored in the storage device 108 using the data structure shown in FIG. 6. In this figure, a defect number 160 is an identification number assigned to defects by the inspection device 100. Chip coordinates 161 are coordinates of a chip containing a defect. Defect coordinates 162 are coordinates of defects relative to coordinate systems where the origins are located at a predetermined point on each individual chip. In the data structure in FIG. 6, if the defect number 160 is specified, the chip coordinates 161 and the defect coordinates 162 can be used to calculate a defect position to move to.

A sampling flag 163 is a flag identifying a defect selected by the sampling operation. In the example shown, '1' indicates a selected defect and 'O' indicates a defect that was not selected. An image name 164 is a name of an image captured by the review device 101 and is available only for defects having a sampling flag of '1'. The test result 165 indicates whether the evaluation results for the electronic test performed on the chip containing the defect is Good or Not good ('G'/'N').

In the example in this figure, G is entered if a defect does not match a region evaluated negatively by the electronic test. In the format shown in this figure, defects showing an 'N' as the test result and a '1' as the sampling flag are collected to categorize critical defect images, and defects showing a 'G' as the test result and a '1' as the sampling flag are collected to categorize non-critical defect images.

(6) Display Image

In an image display step 136, an image associated with coordinates is displayed based on the results from the coordinate consistency checking operation. This is a first characteristic of the present invention. The defect data management server 103 from FIG. 1 reads defect image data and coordinate consistency data, shown in FIG. 6, from the storage device 108. The coordinate consistency data is referred to, and defect images are displayed on the display device 109.

Figure 7A:
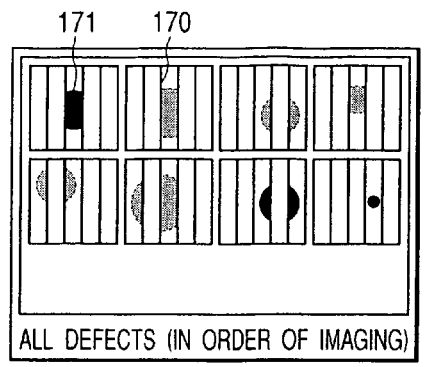
FIGS. 7(a) to 7(c) are diagrams illustrating examples of displayed defect images.
Figure 7B:
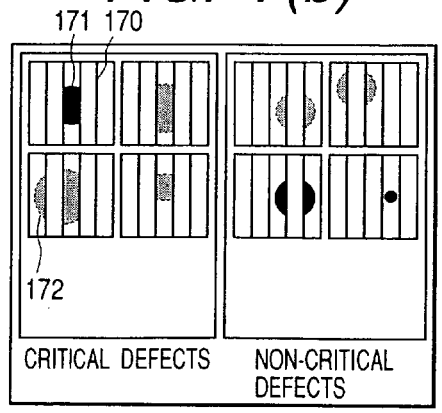
Figure 7C:
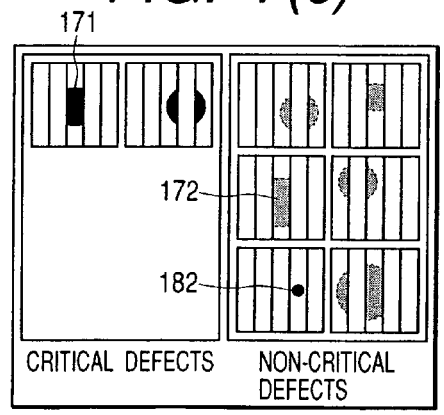

FIGS. 7(a) to 7(c) show examples of displayed images. FIG. 7(a) shows optical microscope arranged in the order that they were captured, of defects generated in the aluminum wiring process for the semiconductor device.

Figure 8:
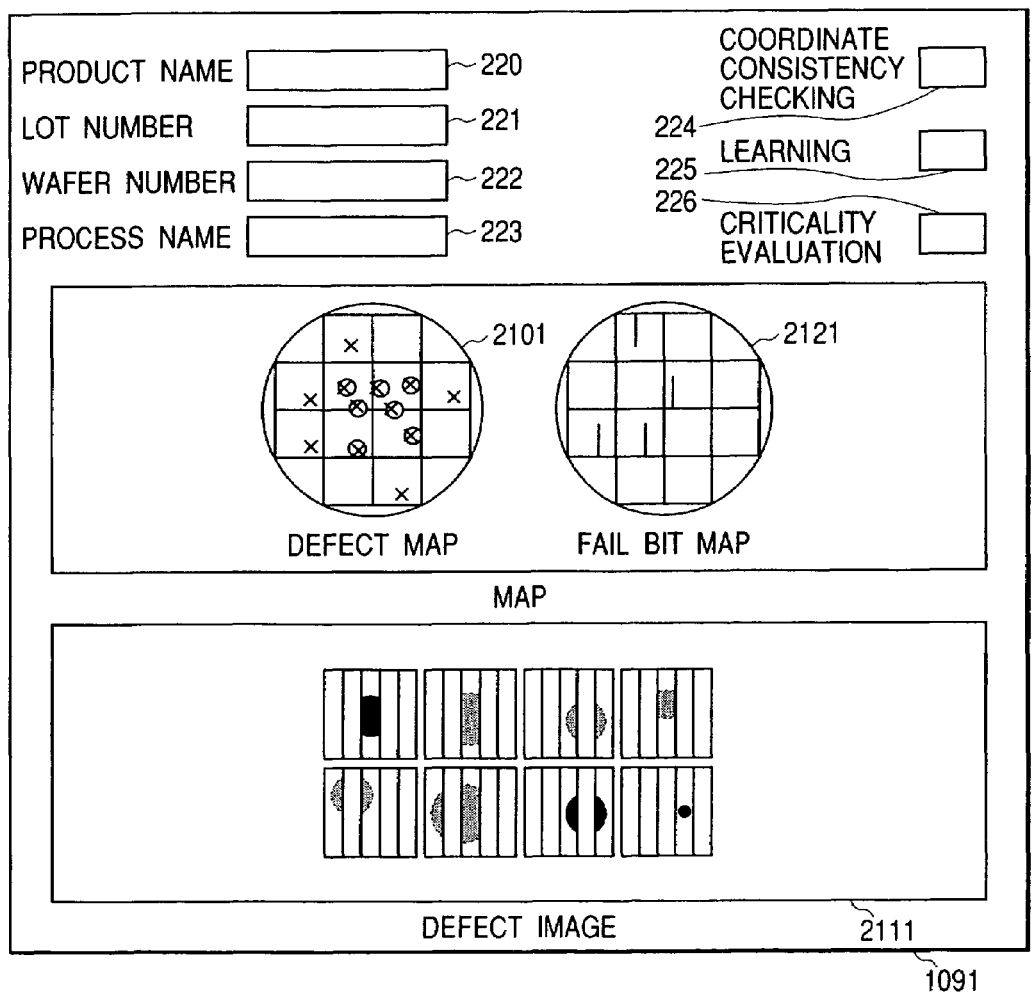
FIG. 8 is a diagram showing an image of defect maps and defect images as displayed on a screen.

FIG. 8 shows a screen 1091 in which the optical microscope image of the defect is displayed on the display device 109. A defect image 2111 corresponds to the image of all defects shown in FIG. 7(a) and is associated with the pre-classification defect image 211 retrieved by the review device 101 shown in FIG. 14. The operator enters a product name 220, a lot number 221, a wafer number 222, and a process name 223 in the screen 1091. Based on this information, the defect coordinates and the fault coordinates 212 and the defect images 211 for this wafer are searched from the storage device 108. The results are displayed on the screen 1091 of the display device 109 as a defect map 2101, a map 2121 of failed bits (one type of fault map), and a defect image 2111.

In addition to aluminum wiring processes, the following description will apply in a similar manner to wiring production processes such as gate wiring. In FIG. 7(b), critical and non-critical defects are classified by manually estimating electronic criticality from the image characteristics. The classification is performed by having the operator observe the images on the display device 109, visually evaluate criticality/non-criticality, and operate the input device 110.

In the example shownin FIG. 7(b), a defect in which a contaminant 171 short-circuits a circuit pattern 170 is assessed as being critical. If there is no short-circuit, the defect is assessed as non-critical. However, whether a containment disposed between two patterns 170 (e.g., a containment 172) is conductive or non-conductive is difficult to determine from images, so the validity of FIG. 7(b) is not definite.

FIG. 7(c) shows displayed images of the results of the coordinate consistency checking initiated by clicking on a coordinate consistency checking button 224 on the display screen 1091 in FIG. 8. If the test result from the consistency data in FIG. 6 is 'G', the defect image is displayed as a noncritical defect. If the test result is 'N', the defect image is displayed as a critical defect.

One advantage of the display shown in FIG. 7(c) is that the critical defects and non-critical defects can be accurately classified using the coordinate consistency checking results. There are many types of defects generated in the production process for semiconductor devices, and the image characteristics for these are also varied. Thus, when assessing criticality of defects from image characteristics, it is difficult to determine which image characteristics should be emphasized.

However, with the image display provided by the present invention, defect criticality can be assessed with guidelines on what image characteristics should be studied. This allows more accurate criticality evaluations to be made. By comparing sunilarities between image characteristics of critical defects and differences between image characteristics of critical and non-critical defects, it is possible to determine image characteristics that can be used to accurately evaluate critical defects. As a result, the number of critical defects can be determined accurately by examining these image characteristics and classifying the defect images.

Furthermore, carefully analyzing the image characteristics of critical defects can provide an estimation on the cause of the critical defects. Also, even if no significant differences between critical and non-critical defects can be observed in the image characteristics, this indicates that distinguishing the two based on images is difficult and unnecessary classification operations can be omitted.

The following is a detailed description of the above embodiment, with reference to FIG. 7(c). Comparing FIG. 7(c) and FIG. 7(b), it can be seen that the short-circuit between the contaminant 172 and the pattern 170 is not relevant to criticality. However, it can be seen that the image of the critical defect (the contaminant 171) is dark and large. The images of non-critical defects (the contaminant 172 and the contaminant 182) are either relatively light or, even if they are dark, they are small.

Figure 9A:
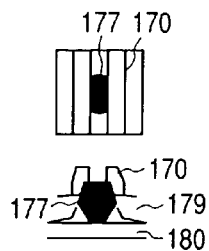
FIGS. 9(a) to 9(c) are diagrams illustrating examples where an image classification field is added to the storage fields of FIGS. 7(a) to 7(c).
Figure 9B:
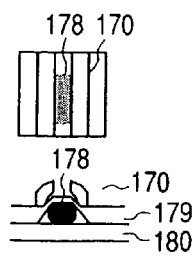
Figure 9C:
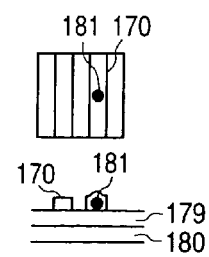

Furthermore, by analyzing the image characteristics in each of the categories, an estimation of the causes of the defects can be made, as shown in FIGS. 9(a) to 9(c), which show a cross-section of the defects from FIG. 7(c). The prominently projected contaminant is dark since it scatters the illuminating light more. The shorter contaminants scatter light to a lesser degree and therefore result in lighter images.

In FIG. 9(a), a dark contaminant 177 is projected prominently so that it breaks through an insulative layer 170, leading to a critical defect with a short-circuit or pattern break in the pattern 170 and a base pattern 180. On the other hand, since a light contaminant 178 shown in FIG. 9(b) has less height, there is no short-circuit in the pattern 170 and the pattern 180, resulting in a non-critical defect. Also, in FIG. 9(c), a dark, small contaminant 181 does not lead to short-circuits or broken patterns due to its size, thus resulting in a non-critical defect.

Based on this, the prominently projected contaminant 177 is a critical defect in this process and setting up a fault prevention measure would be useful. For example, the thickness of the insulative layer 179 could be temporarily increased to prevent short-circuits between the upper pattern 170 and the base pattern 180. Also, more fundamentally, the material of the critical contaminant can be analyzed to determine where it is being generated.

(7) Classify Image

If, using the displayed images from step (6) described above, significant image characteristic differences are found between critical and non-critical defects, classification can be automated using an ADC device. To automate classification using an ADC device, the classification device must be trained. By clicking on a training button 225 displayed on the screen 1091 in FIG. 8, training is carried out based on the results obtained from the displayed images from step (6) above, the accuracy with which critical defects are classified can be improved. This is a second characteristic of the present invention.

In an image classification step 137 shown in FIG. 4, the operator of the defect data management server 103 from FIG. 1 observes the image display results on display device 109 and operates the input device 110. The results of the operations received by the defect data management server 103 are added as new information to the coordinate consistency checking data in FIG. 6 and stored in the storage device 108.

The following is a description of image classification operations suited for ADC training, with reference to FIGS. 10(a) to 10(d). FIG. 10(a) is identical to FIG. 7(c). It is important to note here that image characteristics within the critical defect and non-critical defect categories will not all be the same. Defects leading to electronic faults are caused by different things and these will involve different visual characteristics. The same thing can be said for non-critical defects.

Thus, to train the ADC device, the critical defects and non-critical defects must be categorized further to provide the same image characteristics within the categories. For example, the critical defects in FIG. 10(a) are all dark contaminants 182. However, examining the image characteristics of non-critical defects shows that there are both light contaminants 183 and dark contaminants 184. For this reason, the non-critical defect category must be sub-divided.

To do this, a pointing device (not shown in the figure) is used to indicate the frame for the category to be sub-divided, as shown using the thick frame in FIG. 10(b). Next, frames for the new sub-divided categories are created on the screen, as shown in FIG. 10(c). This corresponds to the bright defects and dark defects shown in this figure. Next, the images in the non-critical defect frame are dragged using the pointing device to the bright defect or the dark defect frame. As shown in FIG. 10(d), this allows the non-critical defects to be divided into two categories.

FIG. 11 shows an example of electronic data containing the results obtained from the image classification operation described above. This electronic data is stored in the memory of the defect data management server 103 by way of the network 104 and is updated as the screen of the display device 109 changes. The data in FIG. 11 is similar to the data shown in FIG. 6, with the addition of an image classification field 174. When a defect on the screen is selected with the pointing device or the like, the corresponding defect number is identified by the defect data management server 103 from FIG. 1. As the image on the screen is moved, the content of the image classification field 174 in the electronic data shown in FIG. 11 is updated.

In the embodiment described above, the sub-dividing of critical defects or non-critical defects is performed manually based on a screen display. However, it would also be possible to perform this operation automatically through a known statistical classification method known as dustering, which does not involve training (Okuno, et. al., Multivariate analysis, 1971, Nikkagiren Shuppansha, pp. 391–412).

(8) Criticality Evaluation

A criticality evaluation step 141 shown in FIG. 4 and FIG. 3 evaluates whether or not the classification results from the ADC device correctly reflect criticality. This is a third important characteristic of the present invention.

The operation is performed in three steps: (a) a defect classification operation; (b) a coordinate consistency checking operation; and (c) a criticality calculation operation. In the defect classification operation (a), the defect data management server 103 from FIG. 1 reads into memory a defect map and an associated defect image stored in the storage device 108. The classification device 111 classifies the defect image and stores the classification results as electronic data, which is then stored in the memory in the defect data management server 103.

The classification results are stored in association with the defect coordinates 162, as shown in FIG. 11. In the coordinate consistency checking operation (b), the defect data management server 103 reads into memory the electronic test results for the position corresponding to the defect coordinates stored in the storage device 108. Coordinate consistency checking is then performed to determine if there is a match with the defect coordinates. In the criticality calculation operation (c), the match rate between the defect coordinates and the electronic test results are tabulated for each of the image classification categories. A criticality rate KR, which is a value used for evaluation, is calculated as shown below. According to this definition, criticality increases as KR approaches 1, and criticality decreases as KR approaches 0.

$$KR = N_N/N_0 \qquad \text{Expression (1)}$$

In expression (1), NN denotes the number of defects where the fault position on the map of failed bits matches defect map coordinates. NO denotes the number of defects in the defect map.

By using this criticality rate, the operator can determine whether or not to redo the image classification operation (the image reclassification branch 139 in FIG. 4), and can determine whether a criticality evaluation based on defect images is possible (the criticality dete ation branch 140 in FIG. 4).

First, the decision of whether or not to redo image classification will be described. The following criticality rates are used to determine whether or not critical defects and noncritical defects have been properly classified.

$$KR1 = N_{N_1}/N_{0_1} \qquad \text{Expression (2)}$$

$$KR2 = -N_{N_2}/N_{0_2} \qquad \text{Expression (3)}$$

Here, criticality rate KR1 is the criticality rate for defects classified as being critical. $N_{N_1}$ is the number of defects in which the defect map matches the coordinates on the map of failed bits. $N_{0_1}$ is the number of defects classified as critical in the defect map. Similarly, KR2 is the criticality rate of defects classified as noncritical defects.

KR1 and KR2 are calculated by the defect data management server 103 from FIG. 1 and are displayed on the display device 109. The operator checks the display results and decides whether or not to re-do the image classification operation. If KR1 and KR2 do not approach ideal values even after re-doing the image classification operation, the operator decides that criticality is difficult to evaluate from defect images and stops image-based criticality evaluations.

Figure 12A:
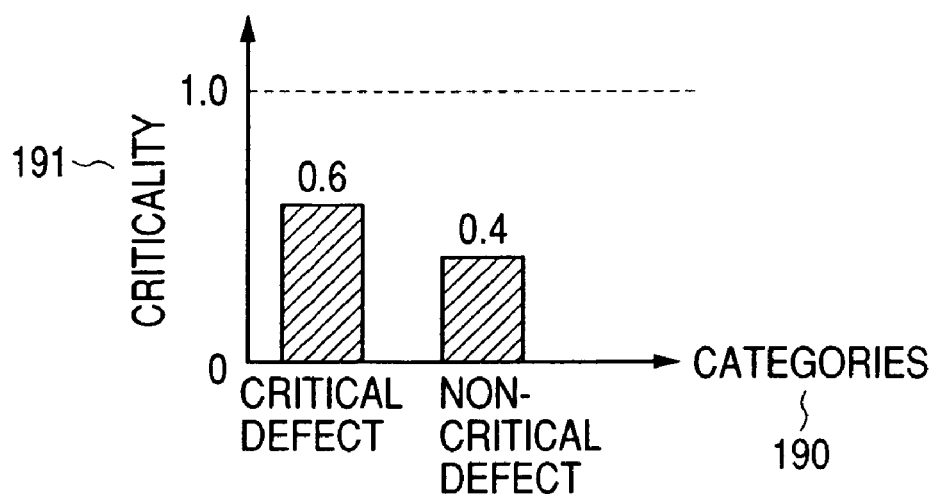
FIGS. 12(a) and 12(b) are diagrams showing an example of results from a semiconductor device production process.
Figure 12B:
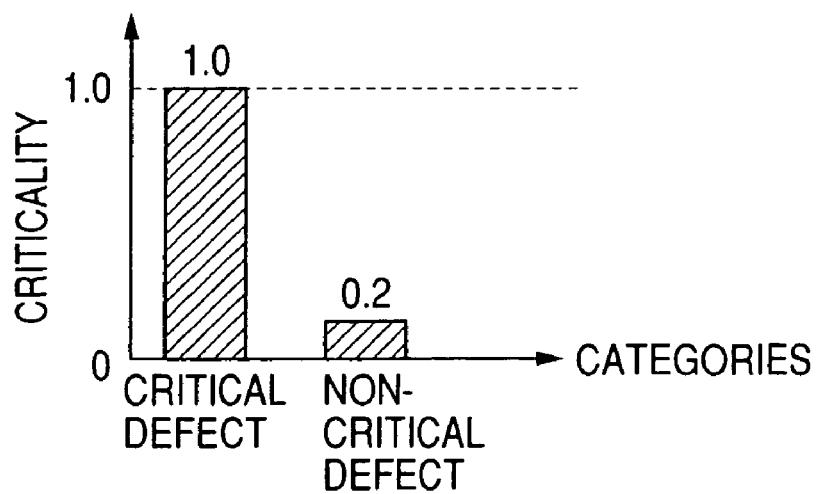

FIGS. 12(a) and 12(b) show sample criticality rate calculation results. In the example in FIG. 12(a), classification of critical/non-critical defects was not performed properly. In FIG. 12(b), the classification was performed properly. In these figures, the horizontal axis represents defect categories 190 and the vertical axis represents a criticality rate 191. The maximum value for the criticality rate is 1.0. Regarding FIG. 12(a), the difference between the criticality (KR1) for critical defects, 0.6, and the criticality (KR2) for non-critical defects, 0.4, is small, and KR1 is much less than the maximum possible criticality value of 1.0. This indicates that classification of critical defects was not performed properly. On the other hands, the results in FIG. 12(b) indicate that 1,CR1 is 1.0, which is the maximum possible criticality value. This indicates that proper classification was performed.

With the present invention, an accurate, quantitative assessment can be made of criticality based on the results of image classification. This allows the operator to know whether image classification should be re-done or not and allows efficient defect analysis. Furthermore, since the operator can assess whether criticality evaluation based on defect images will be difficult or not, unnecessary defect analysis operations can be skipped.

(9) Criticality Evaluation

A criticality evaluation step 141 shown in FIG. 4 and FIG. 3 is performed by the defect data management server 103. Once the preparatory step using the wafer A 121 is completed and it has been determined based on the criticality evaluation step 138 that critical defects can be classified, then the active step for the wafer B 122 is begun.

A specific example will be described, with reference to FIG. 3. When the electronic testing of the wafer A 121 has been completed, a wafer which has not reached the visual inspection process 8 serves as the wafer B 122. In the preparatory stage, the image characteristics of critical defects are determined at the visual inspection process 8. Thus, when the wafer B 122 reaches the visual inspection process 8, defects are imaged and their images 2111 in FIG. 8 are collected. Then, by clicking a criticality evaluation button 226 displayed on the screen 1091 in FIG. 8, critical defects are classified based on these image characteristics. Furthermore, the criticality rates of each of the classified categories has been determined.

In the present invention, the basis for image classifications is associated with the actual electronics testing results, and the degree of correlation is quantified as a criticality rate. As a result, the number of electronic faults determined after wafer completion for a conventional wafer A 121 can be predicted with high accuracy at the time of visual inspection 8 during the processing of the wafer B 122. As a result, the yield can be predicted during an intermediate process and prevention of defects can be started earlier.

The method used to predict yield will be described. Defects can generally be classified as those generated in a concentrated manner and those generated randomly. In the present invention, the classification results for a set of defects selected by sampling can be used for overall predictions. This is suited for random defects. Yield from random defects can, for example, be calculated using the following equation.

$$Y = 1 - T/T_0 \qquad \text{Expression (4)}$$

Here. Y represents the predicted yield. T represents the number of chips containing defects, and To represents the number of inspected chips. However, since not all defects detected by the inspection device will necessarily be critical, criticality can be taken into account. Thus, expression (4) becomes the following equation.

$$Y_i = 1 - KR_i * T_i/T_0 \qquad \text{Expression (5)}$$

Here, Yi, represents the yield based on category i, KR1 represents the criticality of category i, Ti represents the number of chips containing defects classified as category I by the ADC device, and To represents the number of inspected chips.

Figure 13:
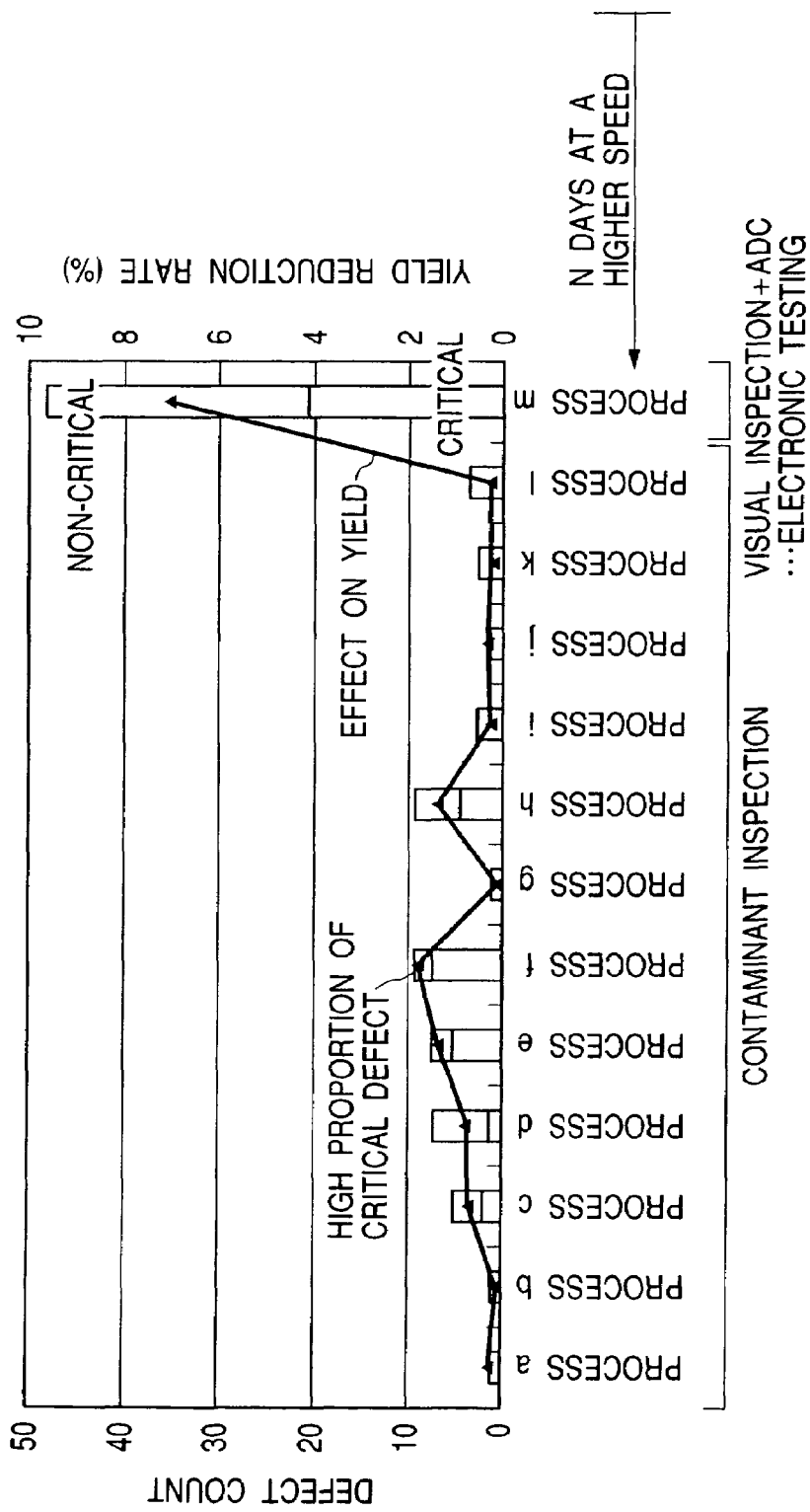
FIG. 13 is a graph of yield predictions as an example of sampling operations.

FIG. 13 shows examples of yield predictions during intermediate processes when expression (5) is used in the present invention. The horizontal axis in the figure represent inspection processes an axis represents the number of defects or yield decreases. In process m in the figure, the number of defects determined by the ADC device to be critical is 21 and the number of non-critical defects is 26. A yield reduction rate DYL can be calculated using expression (5) as follows.

$$\begin{aligned} DYL &= 1 - Y \\ &= KR_i * T_i / T_0 \\ &= 1.0 * 18 / 257 = 7.0\% \end{aligned} \qquad \text{Expression (6)}$$

Of the 21 critical defects, three overlap with other critical defects in the same chip. Thus, the number of chips Ti containing defects is 18. Compared to the conventional method of visual classification, the present invention allows the yield to be calculated accurately. As a result, the presence of critical defects can be recognized quickly and accurately so that the defects to be considered for fault prevention can be determined accurately.

Next, a method for using the yield calculation results described above for fault prevention will be described with reference to FIG. 13 and FIG. 14. Once critical defects are discovered, it is important to identify the causes and especially the processes during which the defects were generated. This allows the focus for critical defect prevention to be narrowed and minimal defects by preventing critical defects from being generated. The coordinate consistency checking operation shown in FIG. 14 is used to identify the process in which a critical defect was generated. For example, defect inspections are performed more often in the processes prior to process m for individual wafers. If, for example, a dark-field inspection device capable of performing high-speed inspections is used for the inspection device 100, frequent defect inspections for processes prior to process in can be performed without delaying the processing of the product.

By checking for consistency between contaminant inspection results 201, 202 and visual inspection results 203 for the same wafer, it is possible to determine the contaminant-generating process that resulted in a visually detected defect. FIG. 13 shows the results of how the defects classified as critical defects in the visual inspection process m are broken down in the contaminant inspections for the twelve processes a through 1. Thus, for the twelve processes, the frequencies at which defects leading to critical defects at process in are generated can be compared, and processes having relatively high critical defect generation frequencies can be identified. In the example shown in FIG. 13, both process f and process h have a high number of defects, but process f has a higher proportion of critical defects, indicating that it should be given priority. This embodiment takes advantage of the characteristic of the present invention that critical defects can be accurately evaluated. If these operations were performed based on inaccurate critical defect classification resulting from conventional visual classification, an erroneous process would be identified as the process generating critical defects, thus preventing effective measures to be taken.

When identifying critical defect generation using the consistency checking operation described above, the efficiency can be improved by performing sampling as indicated in FIG. 15. The logical sum is taken for the multiple defect maps obtained from inspecting the twelve processes a through 1 (e.g., inspection results 2; 203 and inspection results 5; 204). Then, at process m (visual inspection) a sampling operation 206 is performed for the defects resulting from this logical sum. As a result, the criticality/non-criticality evaluation for sampled defects will always allow the process generating the defects to be identified.

As described above, the present invention uses an ADC device to automatically categorize defects and allows highly accurate yields to be calculated using defect counts by categories and criticality rates by categories. Also, these operations can be performed before the electronic testing process is reached. Thus, compared to conventional technologies, yield decreases and the processes at which yield-reducing defects are generated can be identffied earlier during the N days between the visual inspection and the electronic testing (generally 10–90 days depending on the visual inspection process). Thus, fault prevention measures can be implemented efficiently at an early stage and defective products can be minimized.

In the example described above, the wafer A and the wafer B are identical wafer types. However, diffirent types can be used if the production methods are similar. Taking semiconductor devices an example, different products are frequently produced using similar processes. Since defects are often specific to processes, if critical defect classification guidelines are made clear using a certain type of wafer A, then a wafer B produced using a similar process can have critical defects accurately evaluated beginning with the start of production.

In the embodiment described above, classification guidelines are determined after the test results for the wafer A 121 have been determined. However, it would also be possible to predict critical defects using images of the wafer A 121 and determine provisional classification guidelines before the wafer A 121 reaches the electro testing step. Once the wafer A 121 reaches the electronic testing step, classification guidelines can be reexamined according to the embodiment described above.

Furthermore, the preparatory stage with the wafer A 121 can be omitted and operations can be carried out solely for the active stage with the wafer B 122. If critical defects can be clearly determined from the detailed defect information, criticality can be assessed using the detailed defect information before the wafer reaches the electronic testing step. Defect analysis using the critical defect count can be performed as shown in FIGS. 12(*a*) and 12(*b*).

In the first characteristic of the embodiment described above, guidelines are determined to establish the detailed information to focus on when evaluating criticality for different types of defects such as those generated in semiconductor production processes. This allows more accurate criticality evaluations. Since the relation between the detailed defect information and electronic criticality is made clear through objective data operations, classification guidelines for accurately classifying critical defects can be provided.

Another characteristic of the embodiment described above is that a quantitative assessment of whether critical defects have been accurately determined is possible. Thus, a decision can be made on whether to re-evaluate critical defects or not. This allows efficient defect analysis. Furthermore, since a determination can be made on whether criticality evaluation based on the detailed defect information is difficult or not, unnecessary defect analysis operations can be skipped, thus allowing more efficient defect analysis.

Another characteristic of the embodiment described above is that defect criticality, which was determined after completion of the wafer in the conventional technology, can be evaluated in a precise manner in the visual inspection step, which is an intermediate process. Thus, analysis can be performed with higher priority being given to defects generated by yield-reducing factors that lead to high electronic criticality and high frequency of occurrence. This allows fault prevention measures to be started early.

Another characteristic of the embodiment described above is that a criticality rate can be quantitatively determined to indicate correlation between the detailed defect information and the actual electronic testing results as well as the degree of this correlation. As a result, yield, which is determined after wafer completion in the conventional technology, can be accurately determined at a stage before completion. This allows early evaluation of whether or not a required number of working products can be completed in time for a shipping date. By taking measures such as increasing production input, loss of sales opportunities can be prevented beforehand.

Another characteristic of the embodiment described above is that faults detected at the completed stage of the inspected object can be accurately predicted from defects detected in the production process. Thus, prevention of significant defects can be undertaken without having to wait for the final inspection after completion of the product. This allows the yield to be improved at an early stage.

Another characteristic of the embodiment described above is that faults detected at the completed stage of the inspected object can be accurately predicted from defects detected in the production process. Thus, prevention of significant defects can be undertaken without having to wait for the final inspection after completion of the product. This allows the yield to be improved at an early stage.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for analyzing defects in electronic circuit patterns, comprising:

a step for inspecting a first object to detect defects during a production process and obtaining position information of said defects;

a step for detecting images of said defects using said position information of said defects obtained;

a step for performing an electronic test on said first object after said production process is completed to detect faults in said first object and obtain position information of said faults;

a step for comparing said position information of said defects with said position information of said faults and extracting defects having common position information between said defects and said faults;

a step for classifying images of extracted defects into critical defect images and non-critical defect images based on a pre-stored classification rule which defines critical and non-critical defects by referring to images of defects, position information of said defects and results of performing the electronic test to each other;

a step for displaying images of classified defects on a screen by discriminating between said critical defect images and said non-critical defect images;

a step for modifying said pre-stored classification rule by correcting classification of classified defect images displayed on the screen;

a step for inspecting a second object during the production process to detect defects and obtain information of said defects including position information and image of said defects;

a step for classifying images of said defects detected on said second object into critical defects and non-critical defects by using a modified classification rule; and a step for outputting information on said classified defect images of said second object.

2. A method for analyzing defects in electronic circuit patterns comprising:

a step for inspecting a first object to detect defects during a production process and obtaining information relating to said defects on the first object including position information and detailed information, and storing information relating to said position information and detailed information of said defects;

a step for performing an electronic test on said first object after said production process is completed to detect electronic faults in said first object and obtain position information of said electronic faults and storing said position information of said electronic faults;

a step for comparing stored position information of said defects with stored position information of said electronic faults and classifying said stored position information of said defects into critical defects and non-critical defects;

a step for classifying stored detailed information of said defects into critical defects and non-critical defects under a pre-stored classification rule which defines critical and non-critical defects by referring to images of said defects, classified position information of said defects, and results of performing the electronic test to each other;

a step for modifying said pre-stored classification rule by correcting classified detailed information;

a step for inspecting a second object during the production process to detect defects and obtain position information and detailed information of said defects on the second object;

a step for classifying said detailed information of said defects on the second object into critical defects and non-critical defects using a modified classification rule; and a step for outputting information on classified defects.

3. A method as claimed in claim 2, wherein, in the step for classifying said detailed information of said defects on the second object, said non-critical defects are further classified into at least two categories.

4. A method as claimed in claim 2, wherein in the step for outputting, defect generation rate for each defect class classified in the step for classifying said obtained detailed information of said second object is outputted.

5. A method as claimed in claim 2, wherein said detailed information is a defect image.

6. A method for analyzing defects in electronic circuit patterns comprising: a step for inspecting a first object during a production process to detect defects;

a step for obtaining information of said defects including position information of said defects;

a step for performing an electronic test on said first object after said production process has been completed to detect electronic testing faults in said first object;

a step for obtaining position information on said electronic testing faults;

a step for comparing obtained position information of said defects with obtained position information of said electronic testing faults and extracting defects having common position information between said defects and said electronic testing faults;

a step for classifying extracted defects into critical defects and non-critical defects based on a pre-stored classification rule which defines critical and non-critical defects by referring to information of defects including position information of said defects, and results of performing the electronic test to each other;

a step for displaying classified defects on a screen by discriminating between said critical defects and said non-critical defects;

a step for modifying said pre-stored classification rule by correcting a classified result of said defects displayed on the screen;

a step for inspecting a second object during the production process to detect defects and obtain information of said defects including position information of said defects;

a step for classifying said defects detected on said second object into critical defects and non-critical defects by using said modified classification rule; and a step for outputting information on classified defects on said second object.

7. A system for analyzing defects in electronic circuit patterns comprising:

a first memory which stores position information and detailed information of individual defects detected on a first object during a production process;

a second memory which stores position information of electronic testing faults detected on said first object with an electronic test after said production process has been completed;

a comparator which compares said position information of said defects stored in said first memory with said position information of electrical testing faults stored in said second memory;

first classifying means for classifying said position information of said defects either critical defects or non-critical defects using a first classification rule;

second classifying means for classifying said detailed information of said defects either critical defects or non-critical defects referring to classified position information of defects using a second classification rule;

modifying means for modifying said second classification rule by correcting classified detailed information classified by said second classification means;

a third memory for storing both position information and detailed information obtained from a second object during the production process;

third classifying means for classifying said detailed information of defects detected on said second object either critical defects or non-critical defects using a modified second classification rule; and outputting means which outputs information of defects classified by said third classifying means.

8. A system as claimed in claim 7, wherein said second classifying means subdivides at least one of said detailed information of critical defects and that of non-critical defects referring to those similarity before teaching said third classifying means.

9. A method as claimed in claim 2, further comprising:

a step for counting number of the defects classified as critical defects at the step for classifying said detailed information of defects on said second object; and a step for displaying information of a counted number of said defects classified as critical defects.

10. A method as claimed in claim 6, wherein, in the step for classifying said detailed information of defects on said second object, said non-critical defects are further classified into at least two categories.

11. A method as claimed in claim 6, wherein, in the step for outputting, a defect generation rate for each defect class classified in the step for classifying said detailed information of defects on said second object is outputted.

* * * * *